United States Patent
Tang et al.

(10) Patent No.: US 10,270,391 B2
(45) Date of Patent: Apr. 23, 2019

(54) ULTRA-LOW WORKING VOLTAGE RAIL-TO-RAIL OPERATIONAL AMPLIFIER, AND DIFFERENTIAL INPUT AMPLIFICATION-STAGE CIRCUIT AND OUTPUT-STAGE CIRCUIT THEREOF

(71) Applicant: Huawei Technologies Co., Ltd., Shenzhen, Guangdong (CN)

(72) Inventors: Yangyang Tang, Shenzhen (CN); Chen-Xiong Zhang, Plano, TX (US)

(73) Assignee: Huawei Technologies Co., Ltd., Shenzhen (CN)

( * ) Notice: Subject to any disclaimer, the term of this patent is extended or adjusted under 35 U.S.C. 154(b) by 126 days.

(21) Appl. No.: 15/581,445

(22) Filed: Apr. 28, 2017

(65) Prior Publication Data
US 2017/0230005 A1    Aug. 10, 2017

Related U.S. Application Data

(63) Continuation of application No. PCT/CN2015/092895, filed on Oct. 27, 2015.

(30) Foreign Application Priority Data

Oct. 30, 2014    (CN) .......................... 2014 1 0603919

(51) Int. Cl.
*H03F 1/02* (2006.01)
*H03F 3/45* (2006.01)
*H03F 1/38* (2006.01)

(52) U.S. Cl.
CPC ............. *H03F 1/0205* (2013.01); *H03F 1/38* (2013.01); *H03F 3/45183* (2013.01);
(Continued)

(58) Field of Classification Search
CPC .................................................... H03F 1/0205
See application file for complete search history.

(56) References Cited

U.S. PATENT DOCUMENTS

| 5,446,412 A | 8/1995 | Kimyacioglu et al. |
| 6,104,244 A | 8/2000 | Gilbert |

(Continued)

FOREIGN PATENT DOCUMENTS

| CN | 101459412 A | 6/2009 |
| CN | 101794368 A | 8/2010 |

(Continued)

OTHER PUBLICATIONS

Blalock, Benjamin J., et al., "Designing 1-V Op Amps Using Standard Digital CMOS Technology," IEEE Transactions on Circuits and Systems—II: Analog and Digital Signal Processing, vol. 45, No. 7, Jul. 1998, 12 pages.

(Continued)

*Primary Examiner* — Patricia T Nguyen

(57) ABSTRACT

A differential input amplification-stage circuit comprises a voltage unit, first and second bulk-driven transistors, first and second mirror current sources, and a differential amplifier unit. The first and the second bulk-driven transistors respectively receive first and second input voltages, and converts the first and the second input voltages into first and second output currents. The differential amplifier unit separately outputs first and second adjustment currents under an action of voltages output by the first to the third voltage output ends. The first and the second mirror current sources respectively output first and second predetermined currents according to the first output current and the first adjustment current, and the second output current and the second adjustment current, so as to maintain transconductance con- (Continued)

stancy of the differential input amplification-stage circuit. Therefore, output stability is improved.

21 Claims, 6 Drawing Sheets

(52) U.S. Cl.
CPC ..... *H03F 3/45219* (2013.01); *H03F 3/45273* (2013.01); *H03F 2200/135* (2013.01); *H03F 2200/153* (2013.01); *H03F 2200/513* (2013.01); *H03F 2200/87* (2013.01); *H03F 2203/45028* (2013.01); *H03F 2203/45036* (2013.01); *H03F 2203/45051* (2013.01); *H03F 2203/45054* (2013.01); *H03F 2203/45114* (2013.01); *H03F 2203/45124* (2013.01); *H03F 2203/45134* (2013.01); *H03F 2203/45221* (2013.01); *H03F 2203/45281* (2013.01); *H03F 2203/45288* (2013.01); *H03F 2203/45342* (2013.01)

(56) References Cited

U.S. PATENT DOCUMENTS

| | | | |
|---|---|---|---|
| 6,140,877 A | 10/2000 | Forbes | |
| 6,452,448 B1* | 9/2002 | Bonaccio | H03F 3/4521 330/253 |
| 7,088,178 B1* | 8/2006 | Rosenfeld | H03F 3/45219 330/253 |
| 7,187,236 B2 | 3/2007 | Britton, Jr. et al. | |
| 7,265,625 B2* | 9/2007 | Klemmer | H03F 1/301 330/261 |
| 7,391,262 B2 | 6/2008 | Zhang | |
| 7,777,568 B2 | 8/2010 | Lim | |
| 7,847,633 B2 | 12/2010 | Kinget | |
| 7,999,618 B2 | 8/2011 | Moraveji | |
| 8,319,553 B1 | 11/2012 | Ivanov | |
| 2002/0180527 A1 | 12/2002 | Ivanov et al. | |
| 2006/0001491 A1* | 1/2006 | Barou | H03F 1/302 330/257 |
| 2006/0049873 A1 | 3/2006 | Britton, Jr. et al. | |
| 2008/0191802 A1* | 8/2008 | Kinget | H03F 3/45071 330/253 |
| 2008/0272844 A1 | 11/2008 | Rayanakorn et al. | |
| 2009/0027122 A1 | 1/2009 | Bajdechi et al. | |
| 2009/0115524 A1 | 5/2009 | Liu | |
| 2010/0123506 A1* | 5/2010 | Vu | H03F 3/45183 327/333 |
| 2010/0225392 A1 | 9/2010 | Moraveji | |
| 2010/0225394 A1* | 9/2010 | Moraveji | H03F 1/48 330/252 |

FOREIGN PATENT DOCUMENTS

| | | |
|---|---|---|
| CN | 102158188 A | 8/2011 |
| CN | 102394581 A | 3/2012 |
| CN | 103457554 A | 12/2013 |
| CN | 103684282 A | 3/2014 |
| CN | 104506150 A | 4/2015 |

OTHER PUBLICATIONS

Carrillo, Juan M., et al., "1-V Rail-to-Rail CMOS OpAmp With Improved Bulk-Driven Input Stage," IEEE Journal of Solid-State Circuits, vol. 42, No. 3, Mar. 2007, 10 pages.

Chatterjee, Shouri, et al., "0.5-V Analog Circuit Techniques and Their Application in OTA and Filter Design," IEEE Journal of Solid-State Circuits, vol. 40, No. 12, Dec. 2005, 15 pages.

De Langen, Klaas-Jan, et al., "Compact Low-Voltage Power-Efficient Operational Amplifier Cells for VLSI," IEEE Journal of Solid-State Circuits, vol. 33, No. 10, Oct. 1998, 15 pages.

Liu, Zhiyu, "Multi-Voltage Nanoscale CMOS Circuit Techniques," Submitted in Partial Fulfillment of the Requirements for the Degree of Doctor of Philosophy, Department of Electrical and Computer Engineering, University of Wisconsin, Madison, Wisconsin, Apr. 2008, 247 pages.

Monticelli, Dennis M., "A Quad CMOS Single-Supply Op Amp with Rail-to-Rail Output Swing," IEEE Journal of Solid-State Circuits, vol. SC-21, No. 6, Dec. 1986, 9 pages.

Wang, Rongtai, et al., "Partial Positive Feedback for Gain Enhancements of Low-Power CMOS OTAs," Research supported in part by a grant from Starkey Laboratories, Inc., Minnesota, 22 pages.

Zuo, Liang, et al., "Low-Voltage Bulk-Driven Operational Amplifier With Improved Transconductance," IEEE Transactions on Circuits and Systems—I: Regular Papers, vol. 60, No. 8, Aug. 2013, 8 pages.

Juan M Carrillo et al: "Transconductance enhancement in bulk-driven input stages and its applications", Analog Integrated Circuits and Signal Processing, Kluwer Academic Publishers, BO, vol. 68, No. 2, Feb. 8, 2011, 11 pages, XP019924005.

George Raikos et al: "Low-voltage bulk-driven input stage with improved transconductance", International Journal of Circuit Theory and Applications, vol. 39, No. 3, Mar. 1, 2011, 13 pages, XP055411527.

\* cited by examiner

ULTRA-LOW WORKING VOLTAGE RAIL-TO-RAIL OPERATIONAL AMPLIFIER, AND DIFFERENTIAL INPUT AMPLIFICATION-STAGE CIRCUIT AND OUTPUT-STAGE CIRCUIT THEREOF

CROSS-REFERENCE TO RELATED APPLICATIONS

This application is a continuation of International Application No. PCT/CN2015/092895, filed on Oct. 27, 2015, which claims priority to Chinese Patent Application No. 201410603919.X, filed on Oct. 30, 2014. The disclosures of the aforementioned applications are hereby incorporated by reference in their entireties.

TECHNICAL FIELD

The present disclosure relates to the field of electronic technologies, and in particular, to an ultra-low working voltage rail-to-rail operational amplifier, and a differential input amplification-stage circuit and output-stage circuit thereof.

BACKGROUND

With rapid development of a modern semiconductor technology, a conventional design of an analog device faces more challenges. As a supply voltage continuously decreases, the supply voltage is to be smaller and have higher integrity. In addition, a threshold voltage of a complementary metal oxide semiconductor does not change relatively in a linear manner as a size of a transistor changes. In this way, margin space of an adjustment voltage for the conventional design of the analog device becomes smaller, especially in the supply voltage case in which power supply of the analog device is below 1 volt. An operational amplifier is one of most frequently used devices in the analog device, and also is a main device. With power supply with an ultra-low voltage, problems urgent to be resolved of the operational amplifier are a wide range of a working voltage, and stability of an output voltage.

For an ultra-low voltage bulk-driven operational amplifier, transconductance of a differential input stage is different due to changes, of a threshold voltage and an equivalent channel length of a bulk-driven transistor, caused by a technically physical factor or a noise factor in an actual working state, that is, a current that is input to an amplification stage may generate a corresponding non-linear change. Consequently, the operational amplifier is unstable. In addition, the operational amplifier works in an ultra-low voltage state, an existing rail-to-rail output circuit is very complicated, and costs are relatively high.

SUMMARY

Embodiments of the present disclosure provide an ultra-low working voltage rail-to-rail operational amplifier and a differential input amplification-stage circuit thereof, so as to improve stability of the ultra-low working voltage rail-to-rail operational amplifier in different noise cases.

The present disclosure further provides an output-stage circuit, so as to reduce costs of the ultra-low working voltage rail-to-rail operational amplifier.

According to a first aspect of the present disclosure, a differential input amplification-stage circuit is provided, configured to connect to an output-stage circuit, to output, after performing differential amplification on a received first input voltage and a received second input voltage, the amplified first input voltage and the amplified second input voltage to the output-stage circuit, where the differential input amplification-stage circuit includes a voltage unit, a first bulk-driven transistor, a second bulk-driven transistor, a first mirror current source, a second mirror current source, and a differential amplifier unit, where the voltage unit includes a first voltage output end, a second voltage output end, and a third voltage output end, the first voltage output end is connected to the first bulk-driven transistor and the second bulk-driven transistor, to output a control voltage to the first bulk-driven transistor and the second bulk-driven transistor; the first bulk-driven transistor and the second bulk-driven transistor respectively receive the first input voltage and the second input voltage, and respectively convert the first input voltage and the second input voltage into a first output current and a second output current; the first mirror current source is connected to the first bulk-driven transistor, to receive the first output current; the second mirror current source is connected to the second bulk-driven transistor, to receive the second output current; the differential amplifier unit is connected to the first to the third voltage output ends, to output a first adjustment current to the first mirror current source and output a second adjustment current to the second mirror current source under an action of voltages output by the first to the third voltage output ends; the first mirror current source and the second mirror current source are respectively connected to the second voltage output end and the third voltage output end, to receive the control voltage; the first mirror current source outputs a first predetermined current to the output-stage circuit according to the first output current and the first adjustment current; and the second mirror current source outputs a second predetermined current to the output-stage circuit according to the second output current and the second adjustment current, so as to maintain transconductance constancy of the differential input amplification-stage circuit.

In a first possible implementation manner of the first aspect, a control end of the first bulk-driven transistor is grounded, a first end of the first bulk-driven transistor is connected to the first voltage output end, to receive the control voltage, a bulk of the first bulk-driven transistor receives the first input voltage, and a second end of the first bulk-driven transistor is connected to the first mirror current source, to output the first output current to the first mirror current source; and a control end of the second bulk-driven transistor is grounded, a first end of the second bulk-driven transistor is connected to the first voltage output end, to receive the control voltage, a bulk of the second bulk-driven transistor receives the second input voltage, and a second end of the second bulk-driven transistor is connected to the second mirror current source, to output the second output current to the second mirror transistor.

With reference to the first possible implementation manner of the first aspect, in a second possible implementation manner, the voltage unit includes a third bulk-driven transistor, a fourth bulk-driven transistor, and a first transistor, where a control end of the third bulk-driven transistor receives a first bias voltage, to control the voltages output by the first to the third voltage output ends, a first end of the third bulk-driven transistor receives a working voltage, a second end of the third bulk-driven transistor serves as the second voltage output end, and a bulk of the third bulk-driven transistor is connected to a control end of the fourth bulk-driven transistor; a first end of the fourth bulk-driven transistor receives the working voltage, a second end of the fourth bulk-driven transistor serves as the first voltage output end, and a bulk of the fourth bulk-driven transistor is connected to a control end of the first transistor; and a first end of the first transistor receives the working voltage, and a second end of the first transistor serves as the third voltage output end.

With reference to the second possible implementation manner of the first aspect, in a third possible implementation manner, the differential amplifier unit includes a fifth bulk-driven transistor, a second transistor, a third transistor, a fourth transistor, a fifth transistor, and a sixth transistor, where a control end of the fifth bulk-driven transistor is connected to the second end of the fourth bulk-driven transistor, a first end of the fifth bulk-driven transistor receives the working voltage, a second end of the fifth bulk-driven transistor is connected to a first end of the second transistor, and a bulk of the fifth bulk-driven transistor is connected to the second end of the fourth bulk-driven transistor; a control end of the second transistor is connected to a second end of the second transistor, and the first end of the second transistor is further connected to a first end of the third transistor; a second end of the third transistor is further connected to a second end of the fourth transistor, and a control end of the third transistor is connected to the second end of the third transistor; a control end of the fourth transistor is connected to the third voltage output end, a first end of the fourth transistor is grounded, and the second end of the fourth transistor is connected to the first mirror current source, to output the first adjustment current to the first mirror current source; a first end of the fifth transistor is grounded, a second end of the fifth transistor is connected to the second end of the second transistor and the second mirror current source, to output the second adjustment current to the second mirror current source, and the control end of the fifth bulk-driven transistor is further connected to the second voltage output end; and a control end of the sixth transistor receives the bias voltage, a first end of the sixth transistor receives the working voltage, and a second end of the sixth transistor is connected to the first end of the third transistor.

With reference to the third possible implementation manner of the first aspect, in a fourth possible implementation manner, the first mirror current source includes a seventh transistor, an eighth transistor, and a ninth transistor, where a control end of the seventh transistor receives the working voltage, a first end of the seventh transistor is connected to a second end of the eighth transistor, to receive the first output current and the first adjustment current, and a second end of the seventh transistor is connected to the second voltage output end, and is connected to a control end of the eighth transistor; the control end of the eighth transistor is further connected to a control end of the ninth transistor, and a first end of the eighth transistor is grounded; and a first end of the ninth transistor is grounded, and a second end of the ninth transistor is connected to the output-stage circuit, for outputting the first predetermined current to the output-stage circuit.

With reference to the fourth possible implementation manner of the first aspect, in a fifth possible implementation manner, the second mirror current source includes a tenth transistor, an eleventh transistor, and a twelfth transistor, where a control end of the tenth transistor receives the working voltage, a first end of the tenth transistor is connected to a second end of the eleventh transistor, to receive the second output current and the second adjustment current, and a second end of the tenth transistor is connected to the third voltage output end, and is connected to a control end of the eleventh transistor; the control end of the eleventh transistor is further connected to a control end of the twelfth transistor, and a first end of the eleventh transistor is grounded; and a first end of the twelfth transistor is grounded, and a second end of the twelfth transistor is connected to the output-stage circuit, for outputting the second predetermined current to the output-stage circuit.

With reference to the fifth possible implementation manner of the first aspect, in a sixth possible implementation manner, the first to the fifth bulk-driven transistors are N-type bulk-driven transistors, and the control ends, the first ends, and the second ends of the first to the fifth bulk-driven transistors are respectively gates, sources, and drains of the N-type bulk-driven transistors; the first to the third transistors are N-type transistors, and the control ends, the first ends, and the second ends of the first to the third transistors are respectively gates, sources, and drains of the N-type transistors; and the fourth to the twelfth transistors are P-type transistors, and the control ends, the first ends, and the second ends of the fourth to the twelfth transistors are respectively gates, sources, and drains of the fourth to the twelfth transistors.

According to a second aspect, an output-stage circuit is provided, configured to connect to a differential input amplification-stage circuit, to receive a first predetermined current and a second predetermined current, where the output-stage circuit includes an amplifier unit and an output unit, where the amplifier unit is connected to the differential input amplification-stage circuit, to receive the first predetermined current and the second predetermined current, amplifies the first predetermined current and the second predetermined current, and outputs a first amplified current and a second amplified current; and the output unit is connected to the amplifier unit, to receive the first amplified current and the second amplified current, performs differencing and phase inversion on the first amplified current and the second amplified current, and converts the first amplified current and the second amplified current into an output voltage, so that the output voltage falls between a working voltage and zero volts.

In a first possible implementation manner of the second aspect, the amplifier unit includes first to fourth transistors, where a control end of the first transistor is connected to a control end of the second transistor, a first end of the first transistor receives the working voltage, a second end of the first transistor is connected to a second end of the third transistor, and the second end of the first transistor is further connected to the output unit, to output a first amplified current; the control end of the second transistor is further connected to a second end of the fourth transistor, a first end of the second transistor receives the working voltage, and a second end of the second transistor is connected to the second end of the fourth transistor; a control end of the third transistor receives a first bias voltage, and the second end of the third transistor is connected to the differential input amplification-stage circuit, to receive the first predetermined current; a control end of the fourth transistor receives the first bias voltage, a first end of the fourth transistor is grounded, the second end of the fourth transistor is connected to the differential input amplification-stage circuit, to receive the second predetermined current; and the second end of the third transistor is further connected to the output unit, to output the second amplified current, so that the output unit performs differencing and phase inversion on the first amplified current and the second amplified current, and converts the first amplified current and the second amplified current into the output voltage.

With reference to the first possible implementation manner of the second aspect, in a second possible implementation manner, the output unit includes a bulk-driven transistor and a fifth transistor, where a control end of the bulk-driven transistor is connected to the second end of the first transistor, to receive the first amplified current, a first end of the bulk-driven transistor receives the working voltage, a second end of the bulk-driven transistor is connected to a second end of the fifth transistor, and a bulk of the bulk-driven transistor receives a second bias voltage; and a control end of the fifth transistor is connected to the second end of the third transistor, to receive the second amplified current, a first end of the fifth transistor is grounded, and the second end of the fifth transistor outputs the output voltage.

With reference to the second possible implementation manner of the second aspect, in a third possible implementation manner, the output unit further includes a first resistor, a second resistor, a first capacitor, and a second capacitor, where the first resistor and the first capacitor are connected in series between the control end of the bulk-driven transistor and the second end of the bulk-driven transistor, and the second resistor and the second capacitor are connected in series between the control end of the fifth transistor and the second end of the fifth transistor.

With reference to the first possible implementation manner of the second aspect, in a fourth possible implementation manner, the amplifier unit further includes a sixth transistor, a seventh transistor, an eighth transistor, and a ninth transistor, where the second end of the first transistor is connected to the second end of the third transistor by using the sixth transistor and the seventh transistor; the second end of the second transistor is connected to the second end of the fourth transistor by using the seventh transistor and the eighth transistor; a control end of the sixth transistor receives the working voltage; a first end of the sixth transistor is connected to a second end of the seventh transistor, and a second end of the sixth transistor is connected to a first end of the seventh transistor; a control end of the seventh transistor is grounded; a control end of the eighth transistor is grounded, a first end of the eighth transistor is connected to a second end of the ninth transistor, and a second end of the eighth transistor is connected to a first end of the ninth transistor; and a control end of the ninth transistor receives the working voltage.

With reference to the fourth possible implementation manner of the second aspect, in a fifth possible implementation manner, the first transistor, the second transistor, the seventh transistor, and the eighth transistor are N-type transistors, the control end, and the first end, and the second end of the first transistor are respectively a gate, a source, and a drain of the N-type transistor; and the third transistor, the fourth transistor, the fifth transistor, the sixth transistor, and the ninth transistor are P-type transistors, and the control ends, the first ends, and the second ends of the third transistor, the fourth transistor, the fifth transistor, the sixth transistor, and the ninth transistor are respectively gates, sources, and drains of the P-type transistors.

According to a third aspect, an ultra-low working voltage rail-to-rail operational amplifier is provided and includes the differential input amplification-stage circuit according to any one of the possible implementation manners and the output-stage circuit according to any one of the possible implementation manners, where the differential input amplification-stage circuit is connected to the output-stage circuit.

It can be learned from the foregoing technical solutions that the differential input amplification-stage circuit provided in the embodiments of the present disclosure includes the differential amplifier unit. The differential amplifier unit respectively outputs a first adjustment current and a second adjustment current to the first mirror current source and the second mirror current source under an action of control voltages output by the first to the third voltage output ends, so that the first mirror current source outputs the first predetermined current according to the first output current and the first adjustment current, and the second mirror current source outputs the second predetermined current according to the second output current and the second adjustment current, so as to maintain transconductance constancy of the differential input amplification-stage circuit. Therefore, the differential input amplification-stage circuit may output a correct and stable current value, to improve stability of output of the differential input amplification-stage circuit, so that an ultra-low working voltage rail-to-rail operational amplifier having the differential input amplification-stage circuit has good stability.

BRIEF DESCRIPTION OF THE DRAWINGS

To describe the technical solutions in the embodiments of the present disclosure more clearly, the following briefly describes the accompanying drawings for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Embodiments of the present disclosure provide an ultra-low working voltage rail-to-rail operational amplifier, and a differential input amplification-stage circuit and an output-stage circuit thereof, so as to improve stability of the ultra-low working voltage rail-to-rail operational amplifier, and reduce costs of the ultra-low working voltage rail-to-rail operational amplifier.

To make the disclosure objectives, features, and advantages of the present disclosure clearer and more comprehensible, the following clearly describes the technical solutions in the embodiments of the present disclosure with reference to the accompanying drawings in the embodiments of the present disclosure. Apparently, the embodiments described in the following are merely apart rather than all of the embodiments of the present disclosure. All other embodiments obtained by a person of ordinary skill in the art based on the embodiments of the present disclosure without creative efforts shall fall within the protection scope of the present disclosure.

In the specification, claims, and accompanying drawings of the present disclosure, the terms "first", "second", "third", "fourth", and so on (if existent) are intended to distinguish between similar objects but do not necessarily indicate a specific order or sequence. It should be understood that terms used in such a way are interchangeable in proper circumstances so that the embodiments of the present disclosure described herein can be implemented in orders except the order illustrated or described herein. Moreover, the terms "include", "contain" and any other variants thereof mean non-exclusive inclusion. For example, a process, method, system, product, or device that includes a list of steps or units is not necessarily limited to those steps or units, but may include other steps or units not expressly listed or inherent to such a process, method, system, product, or device.

The following separately gives detailed descriptions by means of specific embodiments.

Figure 1:
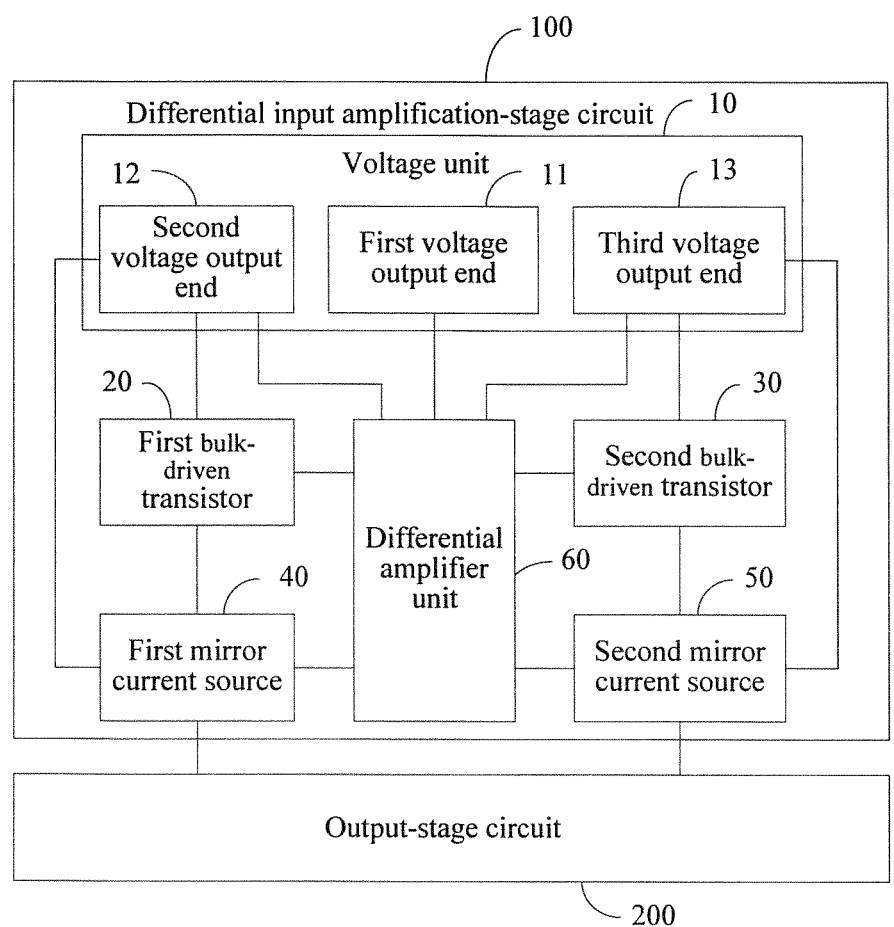
FIG. 1 is a block diagram of a differential input amplification-stage circuit according to an embodiment of a first solution of the present disclosure.
Figure 2:
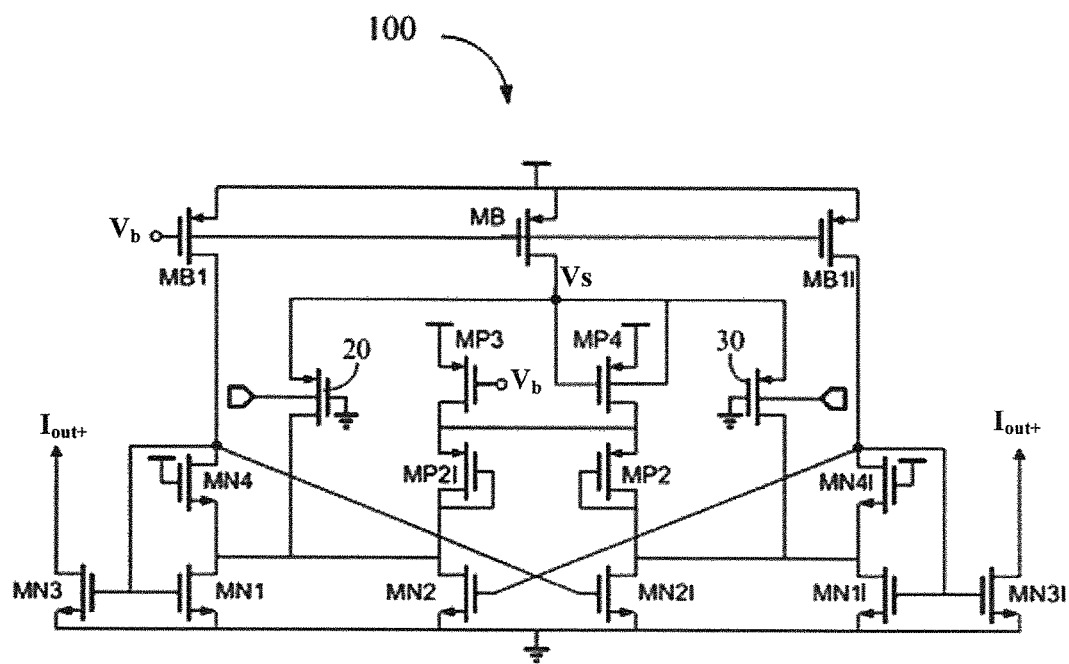
FIG. 2 is a diagram of the circuit in FIG. 1.

Referring to FIG. 1 and FIG. 2, a first embodiment of the present disclosure provides a differential input amplification-stage circuit 100. The differential input amplification-stage circuit 100 is configured to connect to an output-stage circuit 200, to output, after performing differential amplification on a received first input voltage $V_{in-}$ and a received second input voltage $V_{in+}$, the amplified first input voltage $V_{in-}$ and the amplified second input voltage $V_{in+}$ to the output-stage circuit 200. The differential input amplification-stage circuit 100 includes a voltage unit 10, a first bulk-driven transistor 20, a second bulk-driven transistor 30, a first mirror current source 40, a second mirror current source 50, and a differential amplifier unit 60. The voltage unit 10 includes a first voltage output end 11, a second voltage output end 12, and a third voltage output end 13. The first voltage output end 11 is connected to the first bulk-driven transistor 20 and the second bulk-driven transistor 30, to output a control voltage $V_s$ to the first bulk-driven transistor 20 and the second bulk-driven transistor 30. The first bulk-driven transistor 20 and the second bulk-driven transistor 30 respectively receive the first input voltage $V_{in-}$ and the second input voltage $V_{in+}$, and respectively convert the first input voltage $V_{in-}$ and the second input voltage $V_{in+}$ into a first output current and a second output current. The first mirror current source 40 is connected to the first bulk-driven transistor 20, to receive the first output current. The second mirror current source 50 is connected to the second bulk-driven transistor 30, to receive the second output current. The differential amplifier unit 60 is connected to the first voltage output end 11 to the third voltage output end 13, to output a first adjustment current to the first mirror current source 40 and output a second adjustment current to the second mirror current source 50 under an action of voltages output by the first voltage output end 11 to the third voltage output end 13. The first mirror current source 40 and the second mirror current source 50 are respectively connected to the second voltage output end 12 and the third voltage output end 13, to receive the control voltage. The first mirror current source 40 outputs a first predetermined current $I_{out+}$ to the output-stage circuit 200 according to the first output current and the first adjustment current, and the second mirror current source 50 outputs a second predetermined current $I_{out-}$ to the output-stage circuit 200 according to the second output current and the second adjustment current, so as to make transconductance of the differential input amplification-stage circuit 100 constant.

A control end of the first bulk-driven transistor 20 is grounded. A first end of the first bulk-driven transistor 20 is connected to the first voltage output end 11, to receive the control voltage $V_s$. A bulk of the first bulk-driven transistor 20 receives the first input voltage $V_{in-}$. A second end of the first bulk-driven transistor 30 is connected to the first mirror current source 40, to output the first output current to the first mirror current source 40. A control end of the second bulk-driven transistor 30 is grounded, a first end of the second bulk-driven transistor 30 is connected to the first voltage output end 11, to receive the control voltage $V_s$, a bulk of the second bulk-driven transistor 30 receives the second input voltage $V_{in+}$, and a second end of the second bulk-driven transistor 30 is connected to the second mirror current source 50, to output the second output current to the second mirror transistor 50.

It should be noted that because an unstable factor such as a technically physical factor or a noise factor (including a temperature change, a fluctuation of a working voltage, and a parasitic resistance/parasitic capacitance of a device) in an actual working state exists in an existing differential input amplification-stage circuit, the differential input amplification-stage circuit cannot output a correct current. In this solution, the differential input amplification-stage circuit 100 includes the differential amplifier unit 60. The differential amplifier unit 60 respectively outputs a first adjustment current and a second adjustment current to the first mirror current source 40 and the second mirror current source 50 under an action of control voltages output by the first voltage output end 11 to the third voltage output end 13, so that the first mirror current source 40 outputs the first predetermined current $I_{out+}$ according to the first output current and the first adjustment current, and the second mirror current source 50 outputs the second predetermined current $I_{out-}$ according to the second output current and the second adjustment current, so as to maintain transconductance constancy of the differential input amplification-stage circuit 100. Therefore, the differential input amplification-stage circuit 100 may output a correct and stable current value, to improve stability of output of the differential input amplification-stage circuit 100, so that an ultra-low working voltage rail-to-rail operational amplifier having the differential input amplification-stage circuit 100 has good stability.

Therefore, even though an ultra-low working voltage rail-to-rail operational amplifier is affected by an uncertain factor such as a technical factor, a threshold voltage, or equivalent communication, an output current of the differential input amplification-stage circuit 100 in this solution is always maintained on a correct and constant level, so that the ultra-low working voltage rail-to-rail operational amplifier having the differential input amplification-stage circuit 100 has good stability in different noise cases.

Referring to FIG. 2 again, the voltage unit 10 includes a third bulk-driven transistor MB1, a fourth bulk-driven transistor MB, and a first transistor MB11. A control end of the third bulk-driven transistor MB1 receives a first bias voltage $V_b$, to control the voltages output by the first voltage output end 11 to the third voltage output end 13. A first end of the third bulk-driven transistor MB1 receives a working voltage, and a second end of the third bulk-driven transistor MB1 serves as the second voltage output end 12. A bulk of the third bulk-driven transistor MB1 is connected to a control end of the fourth bulk-driven transistor MB. A first end of the fourth bulk-driven transistor MB receives the working voltage, and a second end of the fourth bulk-driven transistor MB serves as the first voltage output end 11. A bulk of the fourth bulk-driven transistor MB is connected to a control end of the first transistor MB11. A first end of the first transistor MB11 receives the working voltage, and a second end of the first transistor MB11 serves as the third voltage output end 13.

The differential amplifier unit 60 includes a fifth bulk-driven transistor MP4, a second transistor MP2, a third transistor MP21, a fourth transistor MN2, a fifth transistor MN21, and a sixth transistor MP3. A control end of the fifth bulk-driven transistor MP4 is connected to the second end of the fourth bulk-driven transistor MB. A first end of the fifth bulk-driven transistor MP4 receives the working voltage. A second end of the fifth bulk-driven transistor MP4 is connected to a first end of the second transistor MP2. A bulk of the fifth bulk-driven transistor MP4 is connected to the second end of the fourth bulk-driven transistor MB. A control end of the second transistor MP2 is connected to a second end of the second transistor MP2, the first end of the second transistor MP2 is further connected to a first end of the third transistor MP21. A second end of the third transistor MP21 is further connected to a second end of the fourth transistor MN2, and a control end of the third transistor MP21 is connected to the second end of the third transistor MP21. A control end of the fourth transistor MN2 is connected to the third voltage output end 13. A first end of the fourth transistor MN2 is grounded, and the second end of the fourth transistor MN2 is connected to the first mirror current source 40, to output the first adjustment current to the first mirror current source 40. A first end of the fifth transistor MN21 is grounded, a second end of the fifth transistor MN21 is connected to the second end of the second transistor MP2 and the second mirror current source 50, to output the second adjustment current to the second mirror current source 50. The control end of the fifth bulk-driven transistor MP4 is further connected to the second voltage output end 12. A control end of the sixth transistor MP3 receives the bias voltage $V_b$. A first end of the sixth transistor MP3 receives the working voltage. A second end of the sixth transistor MP3 is connected to the first end of the third transistor MP21.

It should be noted that the first voltage output end 11 is connected to the control end and the bulk of the fifth bulk-driven transistor MP4, so as to control voltages (that is, back-bias voltages) of the control end and the bulk of the fifth bulk-driven transistor MP4. In this case, a voltage of the first end of the fifth bulk-driven transistor MP4 is the working voltage. Therefore, the fifth bulk-driven transistor MP4 changes conductance of the fifth bulk-driven transistor MP4 and an output current of the second end of the fifth bulk-driven transistor MP4 by controlling the voltage of the bulk of the fifth bulk-driven transistor MP4 by using the first voltage output end 11. In addition, the voltage $V_s$ output by the first voltage output end 11 is adaptive, that is, the voltage $V_s$ output by the first voltage output end 11 adapts itself to a change of the bias voltage $V_b$. Similarly, the voltages output by the second voltage output end 12 and the third voltage output end 13 are also adaptive, that is, the voltages output by the second voltage output end and the third voltage output end adapt themselves to the change of the bias voltage. Therefore, the differential input amplification-stage circuit 100 uses an adaptive mechanism.

The first mirror current source 40 includes a seventh transistor MN4, an eighth transistor MN1, and a ninth transistor MN3. A control end of the seventh transistor MN4 receives the working voltage. A first end of the seventh transistor MN4 is connected to a second end of the eighth transistor MN1, to receive the first output current and the first adjustment current. A second end of the seventh transistor MN4 is connected to the second voltage output end 12, and is connected to a control end of the eighth transistor MN1. The control end of the eighth transistor MN1 is further connected to a control end of the ninth transistor MN3. A first end of the eighth transistor MN1 is grounded. A first end of the ninth transistor MN3 is grounded, and a second end of the ninth transistor MN3 is connected to the output-stage circuit 200, for outputting the first predetermined current $I_{out+}$ to the output-stage circuit 200.

The second mirror current source 50 includes a tenth transistor MN41, an eleventh transistor MN11, and a twelfth transistor MN31. A control end of the tenth transistor MN41 receives the working voltage. A first end of the tenth transistor MN41 is connected to a second end of the eleventh transistor MN11, to receive the second output current and the second adjustment current. A second end of the tenth transistor MN41 is connected to the third voltage output end 13, and is connected to a control end of the eleventh transistor MN11. The control end of the eleventh transistor MN11 is further connected to a control end of the twelfth transistor MN31. A first end of the eleventh transistor MN11 is grounded. A first end of the twelfth transistor MN31 is grounded, and a second end of the twelfth transistor MN31 is connected to the output-stage circuit 200, for outputting the second predetermined current $I_{out-}$ to the output-stage circuit 200.

In this implementation manner, the differential input amplification-stage circuit 100 is applied to an ultra-low working voltage rail-to-rail operational amplifier. The first bulk-driven transistor 20, the second bulk-driven transistor 30, the third bulk-driven transistor MB1, the fourth bulk-driven transistor MB, and the fifth bulk-driven transistor MP4 are N-type bulk-driven transistors. The control ends, the first ends, and the second ends of the first bulk-driven transistor 20, the second bulk-driven transistor 30, the third bulk-driven transistor MB1, the fourth bulk-driven transistor MB, and the fifth bulk-driven transistor MP4 are respectively gates, sources, and drains of the N-type bulk-driven transistors. The first transistor MB11, the second transistor MP2, and the third transistor MP21 are N-type transistors. The control ends, the first ends, and the second ends of the first transistor MB11, the second transistor MP2, and the third transistor MP21 are respectively gates, sources, and drains of the N-type transistors. The fourth transistor MN2, the fifth transistor MN21, the sixth transistor MP3, the seventh transistor MN4, the eighth transistor MN1, the ninth transistor MN3, the tenth transistor MN41, the eleventh transistor MN11, and the twelfth transistor MN31 are P-type transistors, and the control ends, the first ends, and the second ends of the fourth transistor MN2, the fifth transistor MN21, the sixth transistor MP3, the seventh transistor MN4, the eighth transistor MN1, the ninth transistor MN3, the tenth transistor MN41, the eleventh transistor MN11, and the twelfth transistor MN31 are respectively gates, sources, and drains of the P-type transistors.

It should be noted that the first bulk-driven transistor 20 and the second bulk-driven transistor 30 are the same. The second transistor MP2 and the third transistor MP21 are the same. The fourth transistor MN2 and the third transistor MN21 are the same. The seventh transistor MN4 and the tenth transistor MN41 are the same. The eighth transistor MN1 and the eleventh transistor MN11 are the same. The ninth transistor MN3 and the twelfth transistor MN31 are the same.

It can be determined according to FIG. 2 and the foregoing circuit structure of the differential input amplification-stage circuit 100 that transconductance of the differential input amplification-stage circuit 100 is:

$$G_m = \frac{I_{out}}{V_{in}} = \frac{\beta g_{mn1} g_{mb}}{g_{mn1} - g_{mn2} + g_{mp2}}$$

where $g_{mn1}$ is transconductance of the eighth transistor MN1 and the eleventh transistor MN11; $g_{mn2}$ is transconductance of the fourth transistor MN2 and the third transistor MN21; $g_{mp2}$ is transconductance of the second transistor MP2 and the third transistor MP21; and $g_{mp2}$ is transconductance of the fourth bulk-driven transistor MB.

The following can be obtained by substituting the transconductance of each corresponding transistor in the differential input amplification-stage circuit into the foregoing formula:

$$G_m = \frac{\beta \gamma g_{mn1} g_{mpi}}{\left\{ 2\sqrt{K_{mp2}(2\Phi_F + V_{CM} - V_S)\left[I_{mp3} + \frac{1}{2}K_{mp4}(VDD - V_S - |V_{TH}|)^2\right]} \right\}}$$

where VDD is the working voltage; $V_s$ is the voltage output by the first voltage output end 11; β is a scaling ratio of MN3 to MN1 and a scaling ratio of MN31 to MN11; $V_b$ and $V_s$ are adaptive bias voltages; γ is a bulk-effect coefficient; $K_{mp2}=\mu_p C_{ox}(W/L)_{mp2}$; $K_{mp4}=\mu_p C_{ox}(W/L)_{mp4}$; $\mu_p$ is an effective electron mobility of a carrier; $C_{ox}$ is a capacitance per unit of a gate oxide; W is a width of a transistor channel; L is a length of the transistor channel; Φ is a Fermi level coefficient of the bulk; $V_{cm}$ is a value of the input voltage; and $I_{mp3}$ is a drain current of the transistor MP3.

Experiments prove that when a scaling ratio of the sixth transistor MP3 to the fifth bulk-driven transistor MP4 is a preset ratio, the transconductance $G_m$ of the differential input amplification-stage circuit 100 is maintained at a constant value within a full-operation voltage range. That is, due to an uncertain factor such as technical uncertainty, a threshold voltage, or equivalent communication, the output current flowing through the differential input amplification-stage circuit 100 is always maintained on a constant level, thereby improving stability of an ultra-low working voltage rail-to-rail operational amplifier having the differential input amplification-stage circuit 100 in different noise cases.

Figure 3:
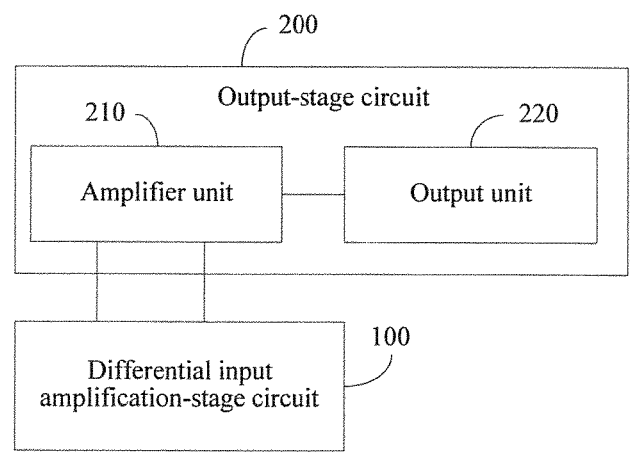
FIG. 3 is a block diagram of an output-stage circuit according to an embodiment of a second solution of the present disclosure.
Figure 4:
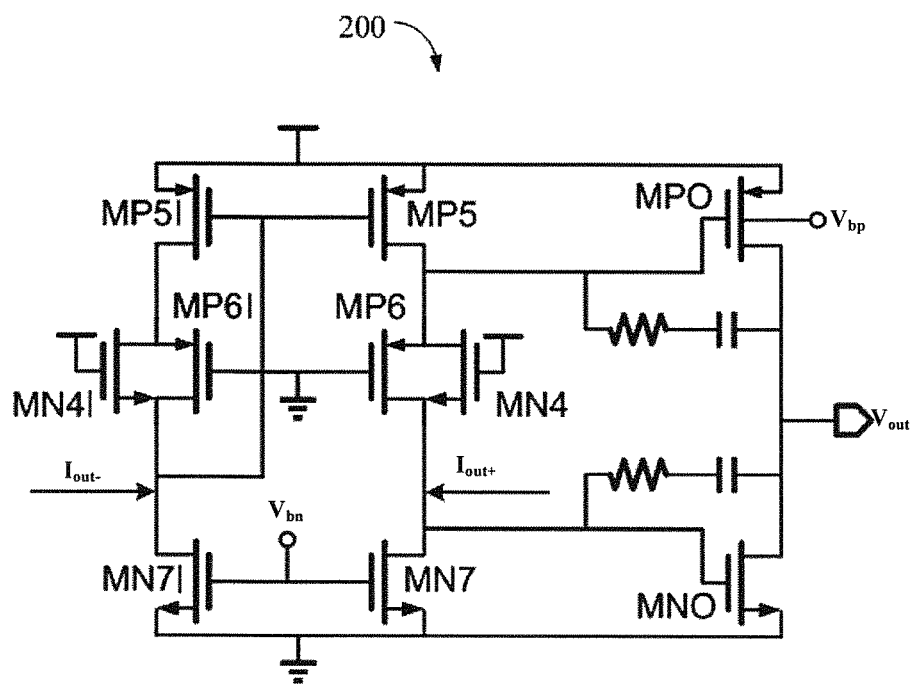
FIG. 4 is a diagram of the circuit in FIG. 3.

Referring to FIG. 3 and FIG. 4, an embodiment of a second solution of the present disclosure provides an output-stage circuit 200, configured to connect to the differential input amplification-stage circuit 100, to receive a first predetermined current $I_{out+}$ and a second predetermined current $I_{out-}$. The output-stage circuit 200 includes an amplifier unit 210 and an output unit 220. The amplifier unit 210 is connected to the differential input amplification-stage circuit 100, to receive the first predetermined current $I_{out+}$ and the second predetermined current $I_{out-}$, amplifies the first predetermined current $I_{out+}$ and the second predetermined current $I_{out-}$, and outputs a first amplified current and a second amplified current. The output unit 220 is connected to the amplifier unit 210, to receive the first amplified current and the second amplified current, performs differencing and phase inversion on the first amplified current and the second amplified current, and converts the first amplified current and the second amplified current into an output voltage $V_{out}$, so that the output voltage $V_{out}$ falls between a working voltage and zero volts.

The amplifier unit 210 includes a first transistor MP5, a second transistor MP51, a third transistor MP7, and a fourth transistor MP71. A control end of the first transistor MP5 is connected to a control end of the second transistor MP51, and a first end of the first transistor MP5 receives the working voltage. A second end of the first transistor MP5 is connected to a second end of the third transistor MP7. The second end of the first transistor MP5 is connected to the output unit 220, to output the first amplified current. The control end of the second transistor MP51 is further connected to a second end of the fourth transistor MP71. A first end of the second transistor MP51 receives the working voltage. A second end of the second transistor MP51 is connected to the second end of the fourth transistor MP71. A control end of the third transistor MP7 receives a first bias voltage $V_{bn}$. The second end of the third transistor MP7 is connected to the differential input amplification-stage circuit, to receive the first predetermined current $I_{out+}$. A control end of the fourth transistor MP71 receives the first bias voltage $V_{bn}$. A first end of the fourth transistor MP71 is grounded, and the second end of the fourth transistor MP71 is connected to the differential input amplification-stage circuit 100, to receive the second predetermined current $I_{out-}$. The second end of the third transistor MP7 is further connected to the output unit 220, to output the second amplified current, so that the output unit 220 performs differencing and phase inversion on the first amplified current and the second amplified current, and converts the first amplified current and the second amplified current into the output voltage $V_{out}$.

It should be noted that the third transistor MN71 and the fourth transistor MN7 form a mirror current source, to play a role of stabilizing, so that the mirror current source plays, with adjustment of the first bias voltage $V_{bn}$, a role of biasing another mirror current source formed by the first transistor MP51 and the second transistor MP5. That is, the mirror current source formed by the first transistor MP51 and the second transistor MP5 is controlled by the working voltage, to play a role of a current source. The mirror current source formed by the first transistor MP51 and the second transistor MP5 and the mirror current source formed by the third transistor MN71 and the fourth transistor MN7 guarantee that the output-stage circuit can still ensure a normal current-amplification function even if an extremely small current (that is, the first predetermined current $I_{out+}$ and the second predetermined current $I_{out-}$) is input, and further ensure output stability.

The output unit 220 includes a bulk-driven transistor MPO and a fifth transistor MNO. A control end of the bulk-driven transistor MPO is connected to the second end of the first transistor MP5, to receive the first amplified current. A first end of the bulk-driven transistor MPO receives the working voltage. A second end of the bulk-driven transistor MPO is connected to a second end of the fifth transistor MNO. A bulk of the bulk-driven transistor MPO receives a second bias voltage $V_{bp}$. A control end of the fifth transistor MNO is connected to the second end of the third transistor MP7, to receive the second amplified current, and a first end of the fifth transistor MNO is grounded. The second end of the fifth transistor MNO outputs the output voltage $V_{out}$.

Further, the output unit 220 further includes a first resistor R1, a second resistor R2, a first capacitor C1, and a second capacitor C2. The first resistor R1 and the first capacitor C1 are connected in series between the control end of the bulk-driven transistor MPO and the second end of the bulk-driven transistor MPO, and the second resistor R2 and the second capacitor C2 are connected in series between the control end of the fifth transistor MNO and the second end of the fifth transistor MNO.

It should be noted that the first resistor R1 and the first capacitor C1 form a first filter circuit to filter the first amplified current output by the amplifier unit 210, so as to provide stability of the output-stage circuit 200. Similarly, the second resistor R2 and the second capacitor C2 form a second filter circuit to filter the second amplified current output by the amplifier unit 210, so as to provide the stability of the output-stage circuit 200.

Further, the amplifier unit 210 includes a sixth transistor MN4, a seventh transistor MP6, an eighth transistor MP61, and a ninth transistor MN41. The second end of the first transistor MP5 is connected to the second end of the third transistor MN7 by using the sixth transistor MN4 and the seventh transistor MP6. The second end of the second transistor MP51 is connected to the second end of the fourth transistor MN71 by using the seventh transistor MP6 and the eighth transistor MP61. A control end of the sixth transistor MN4 receives the working voltage. A first end of the sixth transistor MN4 is connected to a second end of the seventh transistor MP6. A second end of the sixth transistor MN4 is connected to a first end of the seventh transistor MP6. A control end of the seventh transistor MP6 is grounded. A control end of the eighth transistor MP61 is grounded. A first end of the eighth transistor MP61 is connected to a second end of the ninth transistor MN41. A second end of the eighth transistor MP61 is connected to a first end of the ninth transistor MN41. A control end of the ninth transistor MN41 receives the working voltage.

It should be noted that the control ends of the seventh transistor MP6 and the eighth transistor MP61 are grounded, and the control ends of the sixth transistor MN4 and the ninth transistor MN41 receive the working voltage to maintain a normally-open state. Therefore, the seventh transistor MP6, the eighth transistor MP61, the sixth transistor MN4, and the ninth transistor MN41 play a role of amplifying a current flowing through the seventh transistor MP6, the eighth transistor MP61, the sixth transistor MN4, and the ninth transistor MN41.

In this embodiment, the first transistor MP5, the second transistor MP51, the seventh transistor MP6, and the eighth transistor MP61 are N-type transistors. The control end, the first end, and the second end of the first transistor MP5 are respectively a gate, a source, and a drain of the N-type transistor. The third transistor MP7, the fourth transistor MP71, the fifth transistor MNO, the sixth transistor MN4, and the ninth transistor MN41 are P-type transistors. The control ends, the first ends, and the second ends of the third transistor MP7, the fourth transistor MP71, the fifth transistor MO, the sixth transistor MN4, and the ninth transistor MN41 are respectively gates, sources, and drains of the P-type transistors.

In this embodiment, the output-stage circuit 200 implements a function of a rail-to-rail output stage of an ultra-low working voltage rail-to-rail operational amplifier by using only 10 transistors. Compared with an existing complicated rail-to-rail output-stage circuit, an objective of simplifying the rail-to-rail output stage is achieved, thereby reducing costs of the ultra-low working voltage rail-to-rail operational amplifier.

Figure 5:
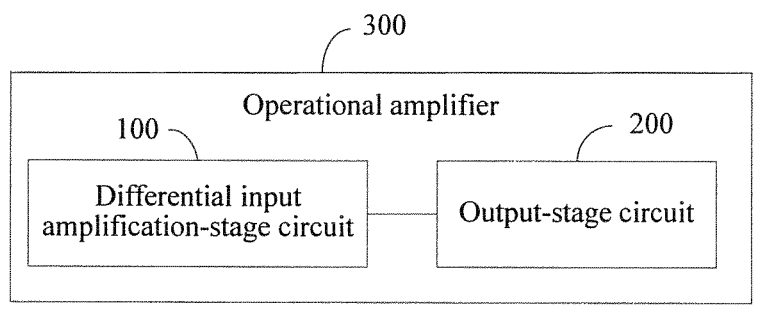
FIG. 5 is a block diagram of an ultra-low working voltage rail-to-rail operational amplifier according to an embodiment of a third solution of the present disclosure.

Referring to FIG. 5, an embodiment of a third solution of the present disclosure provides an ultra-low working voltage rail-to-rail operational amplifier 300. The ultra-low working voltage rail-to-rail operational amplifier 300 includes the differential input amplification-stage circuit 100 provided in the embodiment of the first solution and the output-stage circuit 200 provided in the embodiment of the second solution. The differential input amplification-stage circuit is connected to the output-stage circuit. The differential input amplification-stage circuit 100 and the output-stage circuit 200 are already described in detail in the embodiment of the first solution and the embodiment of the second solution, and therefore details are not described again herein.

In this solution, the ultra-low working voltage rail-to-rail operational amplifier 300 includes the differential input amplification-stage circuit 100. The differential input amplification-stage circuit 100 includes the differential amplifier unit 60. The differential amplifier unit 60 respectively outputs a first adjustment current and a second adjustment current to the first mirror current source 40 and the second mirror current source 50 under an action of control voltages output by the first to the third voltage output ends, so that the first mirror current source 40 outputs the first predetermined current $I_{out+}$ according to the first output current and the first adjustment current, and the second mirror current source 50 outputs the second predetermined current $I_{out-}$ according to the second output current and the second adjustment current, so as to maintain transconductance constancy of the differential input amplification-stage circuit 100. Therefore, the ultra-low working voltage rail-to-rail operational amplifier has good stability in different noise cases. In addition, the ultra-low working voltage rail-to-rail operational amplifier 300 includes the output-stage circuit 200. The output-stage circuit 200 implements a function of a rail-to-rail output stage of the ultra-low working voltage rail-to-rail operational amplifier 300 by using only 10 transistors. Compared with an existing complicated rail-to-rail output-stage circuit, an objective of simplifying the rail-to-rail output stage is achieved, thereby reducing costs of the ultra-low working voltage rail-to-rail operational amplifier 300.

Figure 6:
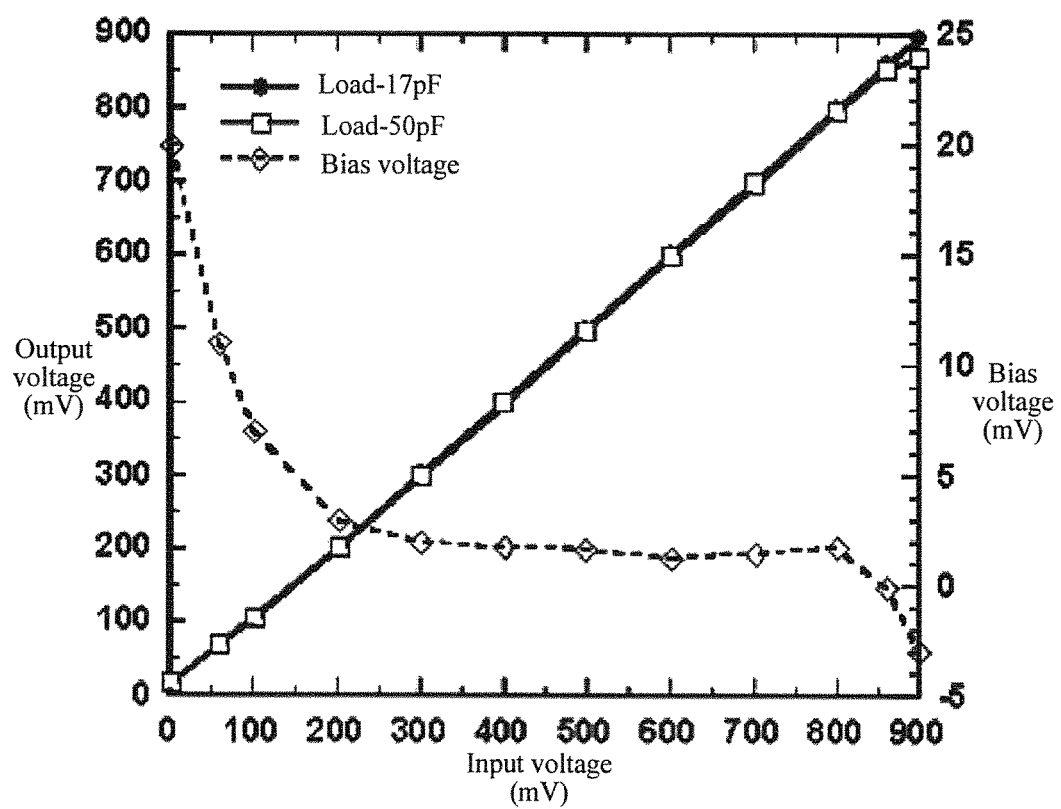
FIG. 6 is a first simulation diagram of the ultra-low working voltage rail-to-rail operational amplifier according to the third solution of the present disclosure.

Referring to FIG. 6, FIG. 6 is a simulation diagram of performing simulation on the ultra-low working voltage rail-to-rail operational amplifier 300. FIG. 6 shows a status of an output voltage $V_{out}$ and a value of a bias voltage of the ultra-low working voltage rail-to-rail operational amplifier 300 when an input voltage of the ultra-low working voltage rail-to-rail operational amplifier 300 changes. Load is respectively 17 pF and 50 pF; $V_{out}$ is the output voltage; $V_{in}$ is the input voltage; and Offset is the bias voltage. It can be learned from FIG. 6 that: The output voltage $V_{out}$ is basically in a linear form, and the output voltage $V_{out}$ can reach a rail-to-rail output voltage. The rail-to-rail output voltage is from 0 V to 900 mV, which is a range of a working voltage. In a range from $V_{in}$=200 my to $V_{in}$=800 my, a bias voltage remains unchanged. Therefore, in the basic range of the working voltage, the bias voltage remains unchanged. Therefore, it can be learned that output of the ultra-low working voltage rail-to-rail operational amplifier 300 is stable.

Figure 7:
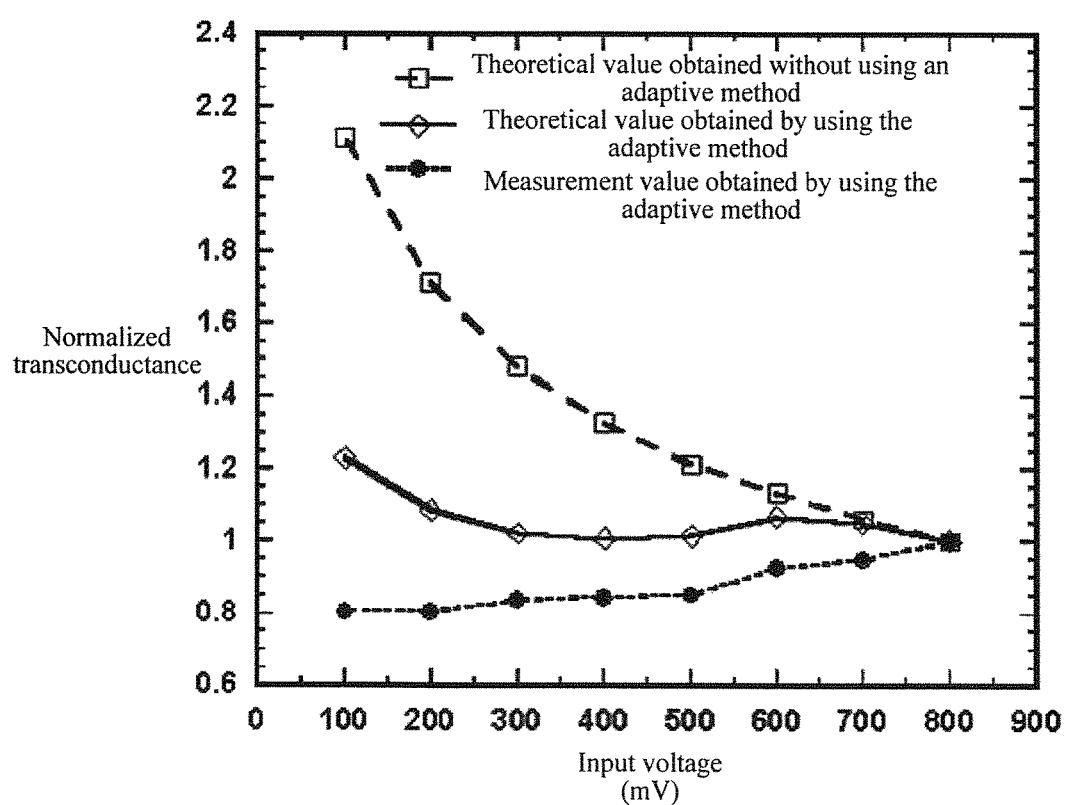
FIG. 7 is a second simulation diagram of the ultra-low working voltage rail-to-rail operational amplifier according to the third solution of the present disclosure.

Referring to FIG. 7, FIG. 7 is a simulation diagram of performing simulation on the ultra-low working voltage rail-to-rail operational amplifier 300. FIG. 7 shows changes of transconductance of a differential input amplification-stage circuit of the ultra-low working voltage rail-to-rail operational amplifier in cases in which the ultra-low working voltage rail-to-rail operational amplifier 300 uses and does not use an adaptive mechanism. It can be learned from FIG. 7 that the transconductance of the differential input amplification-stage circuit basically remains unchanged in cases of different differential input voltages when the ultra-low working voltage rail-to-rail operational amplifier 300 uses the adaptive mechanism. Because the ultra-low working voltage rail-to-rail operational amplifier 300 in this solution uses the adaptive mechanism, the transconductance of the differential input amplification-stage circuit 100 of the ultra-low working voltage rail-to-rail operational amplifier 300 in this solution basically remains unchanged, that is, basically keeps constancy of an output current, so as to resist impact of another uncertain factor (such as a temperature change, or impact of a parasitic resistance) on a working state of the ultra-low working voltage rail-to-rail operational amplifier 300.

Figure 8:
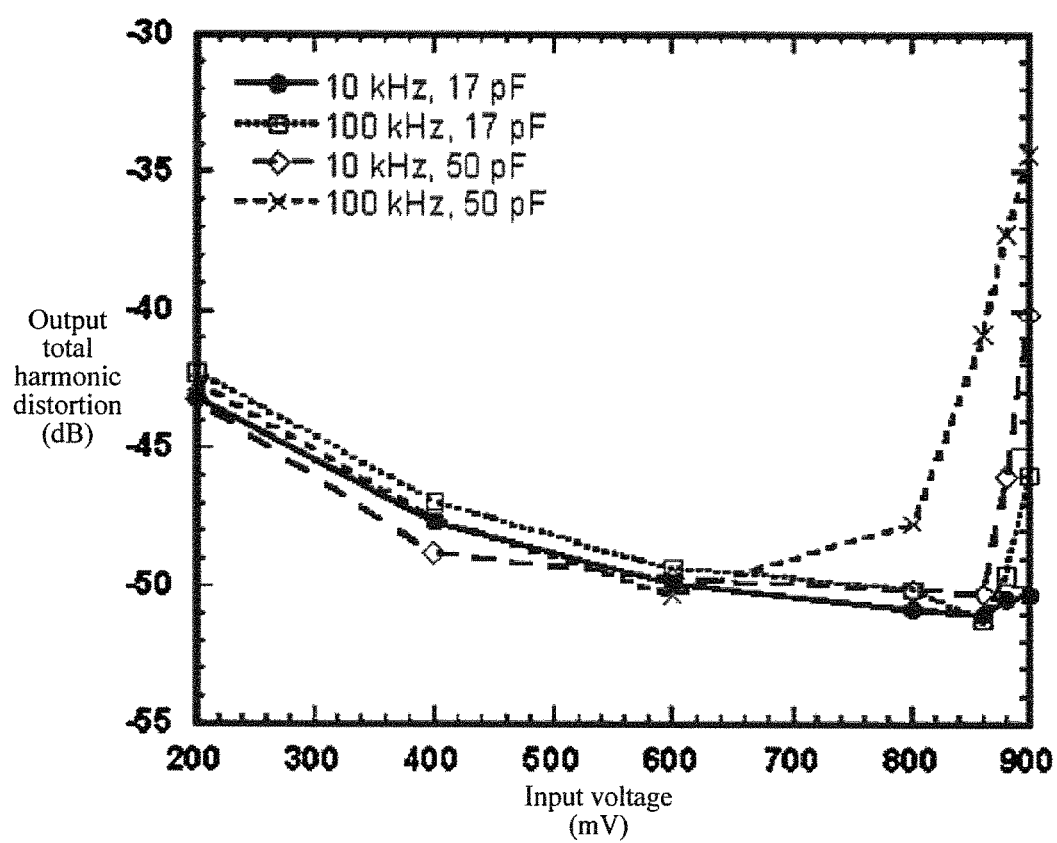
FIG. 8 is a third simulation diagram of the ultra-low working voltage rail-to-rail operational amplifier according to the third solution of the present disclosure.

Referring to FIG. 8, FIG. 8 is a simulation diagram of performing simulation on the ultra-low working voltage rail-to-rail operational amplifier 300. FIG. 8 shows total harmonic distortion (THD) of different cases when an input voltage changes in a range of a working voltage. In the cases, frequencies are 10 kHz and 100 kHz and output load is respectively 17 pF and 50 pF. The output total harmonic distortion is an index used for measuring a noise magnitude of the ultra-low working voltage rail-to-rail operational amplifier. It can be learned from FIG. 8 that the distortion of the ultra-low working voltage rail-to-rail operational amplifier 300 is basically maintained at −50 db. Therefore, output noise of the ultra-low working voltage rail-to-rail operational amplifier 300 is greatly reduced.

It may be clearly understood by a person skilled in the art that, for the purpose of convenient and brief description, for a detailed working process of the foregoing system, apparatus, and unit, reference may be made to a corresponding process in the foregoing method embodiments, and details are not described again herein.

The foregoing describes in detail an ultra-low working voltage rail-to-rail operational amplifier, and a differential input amplification-stage circuit and an output-stage circuit thereof that are provided in the present disclosure. For a person of ordinary skill in the art, specific embodiments and an application scope may be changed according to an idea of the embodiments of the present disclosure. In conclusion, content of this specification should not be construed as a limitation on the present disclosure.

What is claimed is:

1. A differential input amplification-stage circuit configured to connect to an output-stage circuit for differential amplification of a received first input voltage and a received second input voltage, for outputting the first input voltage to the output-stage circuit after the first input voltage is amplified, and for outputting the second input voltage to the output-stage circuit after the second input voltage is amplified, the differential input amplification-stage circuit comprising:
   a voltage source comprising a first voltage output end, a second voltage output end, and a third voltage output end;
   a first bulk-driven transistor and a second bulk-driven transistor, wherein the first bulk-driven transistor is configured to receive the first input voltage and convert the first input voltage into a first output current, wherein the first voltage output end is connected to the first bulk-driven transistor and the second bulk-driven transistor, and wherein the first voltage output end is configured to output a control voltage to the first bulk-driven transistor and the second bulk-driven transistor;
   the second bulk-driven transistor is configured to receive the second input voltage and convert the second input voltage into a second output current;
   a first mirror current source connected to the first bulk-driven transistor and the second voltage output end, wherein the first mirror current source is configured to receive the first output current;
   a second mirror current source connected to the second bulk-driven transistor and the third voltage output end, wherein the second mirror current source is configured to receive the second output current;
   a differential amplifier connected to the first voltage output end and the third voltage output end and configured to:
      output a first adjustment current to the first mirror current source in response to the first voltage output end outputting a voltage, and
      output a second adjustment current to the second mirror current source in response to the third voltage output end outputting a voltage;
   wherein the first mirror current source is configured to output a first predetermined current to the output-stage circuit according to the first output current and the first adjustment current; and
   wherein the second mirror current source is configured to output a second predetermined current to the output-stage circuit according to the second output current and the second adjustment current to maintain a transconductance constancy of the differential input amplification-stage circuit.

2. The differential input amplification-stage circuit according to claim 1, wherein:
   a control end of the first bulk-driven transistor is grounded;
   a first end of the first bulk-driven transistor is connected to the first voltage output end to receive the control voltage;
   a bulk of the first bulk-driven transistor is configured to receive the first input voltage;
   a second end of the first bulk-driven transistor is connected to the first mirror current source to output the first output current to the first mirror current source;
   a control end of the second bulk-driven transistor is grounded;
   a first end of the second bulk-driven transistor is connected to the first voltage output end to receive the control voltage;
   a bulk of the second bulk-driven transistor is configured to receive the second input voltage; and
   a second end of the second bulk-driven transistor is connected to the second mirror current source to output the second output current to a second mirror transistor.

3. The differential input amplification-stage circuit according to claim 2, wherein:
   the voltage source further comprises a third bulk-driven transistor, a fourth bulk-driven transistor, and a first transistor;
   a control end of the third bulk-driven transistor is configured to receive a first bias voltage and control voltage outputs by the first voltage output end, the second voltage output end, and the third voltage output end;
   a first end of the third bulk-driven transistor is configured to receive a working voltage;
   a second end of the third bulk-driven transistor is configured to serve as the second voltage output end;

a bulk of the third bulk-driven transistor is connected to a control end of the fourth bulk-driven transistor;
a first end of the fourth bulk-driven transistor is configured to receive the working voltage;
a second end of the fourth bulk-driven transistor is configured to serve as the first voltage output end;
a bulk of the fourth bulk-driven transistor is connected to a control end of the first transistor;
a first end of the first transistor is configured to receive the working voltage; and
a second end of the first transistor is configured to serve as the third voltage output end.

4. The differential input amplification-stage circuit according to claim 3, wherein:
the differential amplifier comprises a fifth bulk-driven transistor, a second transistor, a third transistor, a fourth transistor, a fifth transistor, and a sixth transistor;
a control end of the fifth bulk-driven transistor is connected to the second end of the fourth bulk-driven transistor;
a first end of the fifth bulk-driven transistor is configured to receive the working voltage;
a second end of the fifth bulk-driven transistor is connected to a first end of the second transistor;
a bulk of the fifth bulk-driven transistor is connected to the second end of the fourth bulk-driven transistor;
a control end of the second transistor is connected to a second end of the second transistor;
the first end of the second transistor is further connected to a first end of the third transistor;
a second end of the third transistor is further connected to a second end of the fourth transistor;
a control end of the third transistor is connected to the second end of the third transistor;
a control end of the fourth transistor is connected to the third voltage output end;
a first end of the fourth transistor is grounded;
the second end of the fourth transistor is connected to the first mirror current source to output the first adjustment current to the first mirror current source;
a first end of the fifth transistor is grounded;
a second end of the fifth transistor is connected to the second end of the second transistor and the second mirror current source to output the second adjustment current to the second mirror current source;
the control end of the fifth bulk-driven transistor is further connected to the second voltage output end; and
a control end of the sixth transistor is configured to receive the first bias voltage;
a first end of the sixth transistor is configured to receive the working voltage; and
a second end of the sixth transistor is connected to the first end of the third transistor.

5. The differential input amplification-stage circuit according to claim 4, wherein:
the first mirror current source comprises a seventh transistor, an eighth transistor, and a ninth transistor;
a control end of the seventh transistor is configured to receive the working voltage;
a first end of the seventh transistor is connected to a second end of the eighth transistor to receive the first output current and the first adjustment current;
a second end of the seventh transistor is connected to the second voltage output end and a control end of the eighth transistor;
the control end of the eighth transistor is further connected to a control end of the ninth transistor;

a first end of the eighth transistor is grounded;
a first end of the ninth transistor is grounded; and
a second end of the ninth transistor is connected to the output-stage circuit to output the first predetermined current to the output-stage circuit.

6. The differential input amplification-stage circuit according to claim 5, wherein:
the second mirror current source comprises a tenth transistor, an eleventh transistor, and a twelfth transistor;
a control end of the tenth transistor is configured to receive the working voltage;
a first end of the tenth transistor is connected to a second end of the eleventh transistor to receive the second output current and the second adjustment current;
a second end of the tenth transistor is connected to the third voltage output end and a control end of the eleventh transistor;
the control end of the eleventh transistor is further connected to a control end of the twelfth transistor;
a first end of the eleventh transistor is grounded;
a first end of the twelfth transistor is grounded; and
a second end of the twelfth transistor is connected to the output-stage circuit to output the second predetermined current to the output-stage circuit.

7. The differential input amplification-stage circuit according to claim 6, wherein:
each of the first bulk-driven transistor, the second bulk-driven transistor, the third bulk-driven transistor, the fourth bulk-driven transistor, and the fifth bulk-driven transistor is an N-type bulk-driven transistor;
the control end of each of the first bulk-driven transistor, the second bulk-driven transistor, the third bulk-driven transistor, the fourth bulk-driven transistor, and the fifth bulk-driven transistor comprises a gate of the N-type bulk-driven transistor;
the first end of each of the first bulk-driven transistor, the second bulk-driven transistor, the third bulk-driven transistor, the fourth bulk-driven transistor, and the fifth bulk-driven transistor comprises a source of the N-type bulk-driven transistor;
the second end of each of the first bulk-driven transistor, the second bulk-driven transistor, the third bulk-driven transistor, the fourth bulk-driven transistor, and the fifth bulk-driven transistor comprises a drain of the N-type bulk-driven transistor;
each of the first transistor, the second transistor, and the third transistor is an N-type transistor;
the control end of each of the first transistor, the second transistor, and the third transistor is a gate of the N-type transistor;
the first end of each of the first transistor, the second transistor, and the third transistor is a source of the N-type transistor;
the second end of each of the first transistor, the second transistor, and the third transistor is a drain of the N-type transistor;
each of the fourth transistor, the fifth transistor, the sixth transistor, the seventh transistor, the eighth transistor, the ninth transistor, the tenth transistor, the eleventh transistor, and the twelfth transistor is a P-type transistor;
the control end of each of the fourth transistor, the fifth transistor, the sixth transistor, the seventh transistor, the eighth transistor, the ninth transistor, the tenth transistor, the eleventh transistor, and the twelfth transistor comprises a gate;

the first end of each of the fourth transistor, the fifth transistor, the sixth transistor, the seventh transistor, the eighth transistor, the ninth transistor, the tenth transistor, the eleventh transistor, and the twelfth transistor comprises a source; and the second end of each of the fourth transistor, the fifth transistor, the sixth transistor, the seventh transistor, the eighth transistor, the ninth transistor, the tenth transistor, the eleventh transistor, and the twelfth transistor comprises a drain.

8. An output-stage circuit configured to connect to a differential input amplification-stage circuit and receive a first predetermined current and a second predetermined current, the output-stage circuit comprising:

an amplifier unit configured to receive the first predetermined current and the second predetermined current from a differential input amplification-stage circuit, amplify the first predetermined current and the second predetermined current, and output a first amplified current and a second amplified current; and an output unit connected to the amplifier unit and configure to receive the first amplified current and the second amplified current, perform differencing and phase inversion on the first amplified current and the second amplified current, and convert the first amplified current and the second amplified current into an output voltage, so that the output voltage falls between a working voltage and zero volts.

9. The output-stage circuit according to claim 8, wherein the amplifier unit comprises:

first, second, third and fourth transistors;

wherein a control end of the first transistor is connected to a control end of the second transistor, a first end of the first transistor receives the working voltage, a second end of the first transistor is connected to a second end of the third transistor, and the second end of the first transistor is further connected to the output unit, to output a first amplified current;

wherein the control end of the second transistor is further connected to a second end of the fourth transistor, a first end of the second transistor receives the working voltage, and a second end of the second transistor is connected to the second end of the fourth transistor;

a control end of the third transistor receives a first bias voltage, and the second end of the third transistor is connected to the differential input amplification-stage circuit, to receive the first predetermined current;

a control end of the fourth transistor receives the first bias voltage, a first end of the fourth transistor is grounded, the second end of the fourth transistor is connected to the differential input amplification-stage circuit, to receive the second predetermined current; and wherein the second end of the third transistor is further connected to the output unit, to output the second amplified current, so that the output unit performs differencing and phase inversion on the first amplified current and the second amplified current, and converts the first amplified current and the second amplified current into the output voltage.

10. The output-stage circuit according to claim 9, wherein the output unit comprises:

a bulk-driven transistor and a fifth transistor, wherein a control end of the bulk-driven transistor is connected to the second end of the first transistor, to receive the first amplified current, a first end of the bulk-driven transistor receives the working voltage, a second end of the bulk-driven transistor is connected to a second end of the fifth transistor, and a bulk of the bulk-driven transistor receives a second bias voltage; and a control end of the fifth transistor is connected to the second end of the third transistor, to receive the second amplified current, a first end of the fifth transistor is grounded, and the second end of the fifth transistor outputs the output voltage.

11. The output-stage circuit according to claim 10, wherein the output unit further comprises:

a first resistor, a second resistor, a first capacitor, and a second capacitor; and wherein the first resistor and the first capacitor are connected in series between the control end of the bulk-driven transistor and the second end of the bulk-driven transistor, and the second resistor and the second capacitor are connected in series between the control end of the fifth transistor and the second end of the fifth transistor.

12. The output-stage circuit according to claim 9, wherein the amplifier unit further comprises:

a sixth transistor, a seventh transistor, an eighth transistor, and a ninth transistor;

wherein the second end of the first transistor is connected to the second end of the third transistor by using the sixth transistor and the seventh transistor;

wherein the second end of the second transistor is connected to the second end of the fourth transistor by using the seventh transistor and the eighth transistor;

a control end of the sixth transistor receives the working voltage;

a first end of the sixth transistor is connected to a second end of the seventh transistor, and a second end of the sixth transistor is connected to a first end of the seventh transistor;

a control end of the seventh transistor is grounded;

a control end of the eighth transistor is grounded, a first end of the eighth transistor is connected to a second end of the ninth transistor, and a second end of the eighth transistor is connected to a first end of the ninth transistor; and a control end of the ninth transistor receives the working voltage.

13. The output-stage circuit according to claim 12, wherein:

the first transistor, the second transistor, the seventh transistor, and the eighth transistor are N-type transistors, the control end, and the first end, and the second end of the first transistor are respectively a gate, a source, and a drain of the N-type transistor; and the third transistor, the fourth transistor, the fifth transistor, the sixth transistor, and the ninth transistor are P-type transistors, and the control ends, the first ends, and the second ends of the third transistor, the fourth transistor, the fifth transistor, the sixth transistor, and the ninth transistor are respectively gates, sources, and drains of the P-type transistors.

14. An ultra-low working voltage rail-to-rail operational amplifier, comprising:

a differential input amplification-stage circuit, comprising:

a voltage source comprising a first voltage output end, a second voltage output end, and a third voltage output end, a first bulk-driven transistor and a second bulk-driven transistor, wherein the first bulk-driven transistor is configured to receive a first input voltage and convert the first input voltage into a first output current, wherein the first voltage output end is connected to the first bulk-driven transistor and to the second bulk-driven transistor, and wherein the first voltage output end is configured to output a control voltage to the first bulk-driven transistor and the second bulk-driven transistor, the second bulk-driven transistor is configured to receive a second input voltage and convert the second input voltage into a second output current, a first mirror current source connected to the first bulk-driven transistor and the second voltage output end, wherein the first mirror current source is configured to receive the first output current, a second mirror current source connected to the second bulk-driven transistor and the third voltage output end, wherein the second mirror current is configured to receive the second output current, a differential amplifier connected to the first voltage input end and the third voltage output end, wherein the differential amplifier is configured to:

output a first adjustment current to the first mirror current source in response to the first voltage output end outputting a voltage, and output a second adjustment current to the second mirror current source in response to the third voltage output end outputting a voltage, wherein the first mirror current source is configured to output a first predetermined current to an output-stage circuit according to the first output current and the first adjustment current, and wherein the second mirror current source is configured to output a second predetermined current to the output-stage circuit according to the second output current and the second adjustment current to maintain a transconductance constancy of the differential input amplification-stage circuit; and the output-stage circuit connected to the differential input amplification-stage circuit, the output stage circuit comprising:

an amplifier configured to:

receive the first predetermined current and the second predetermined current from the differential input amplification-stage circuit, amplify the first predetermined current and the second predetermined current, and output a first amplified current and a second amplified current, and an output unit connected to the amplifier, wherein the output unit is configure to:

receive the first amplified current and the second amplified current, perform differencing and phase inversion on the first amplified current and the second amplified current, and convert the first amplified current and the second amplified current into an output voltage so that the output voltage falls is between a working voltage and zero volts.

15. A method implemented by a differential input amplification-stage circuit configured to connect to an output-stage circuit, the method comprising:

receiving, by a first bulk-driven transistor of the differential input amplification-stage circuit, a first input voltage;

converting, by the first bulk-driven transistor of the differential input amplification-stage circuit, the first input voltage to a first output current;

receiving, by a second bulk-driven transistor of the differential input amplification-stage circuit, a second input voltage;

converting, by the second bulk-driven transistor of the differential input amplification-stage circuit, the second input voltage to a second output current;

receiving, by the first bulk-driven transistor of the differential input amplification-stage circuit and by the second bulk-driven transistor of the differential input amplification-stage circuit; a control voltage from a first voltage output end of a voltage source of the differential input amplification-stage circuit;

outputting, by the first bulk-driven transistor of the differential input amplification-stage circuit, the first output current to a first mirror current source of the differential input amplification-stage circuit;

outputting, by the second bulk-driven transistor of the differential input amplification-stage circuit, the second output current to a second mirror current source of the differential input amplification-stage circuit;

outputting, by a differential amplifier of the differential input amplification-stage circuit, a first adjustment current to the first mirror current source in response to the first voltage output end of the voltage source outputting a voltage, wherein the differential amplifier is connected to the first voltage output end and a third voltage output end of the voltage source;

outputting, by the differential amplifier of the differential input amplification-stage circuit, a second adjustment current to the second mirror current source in response to a second voltage output end of the voltage source outputting a voltage;

outputting, by the first mirror current source of the differential input amplification-stage circuit, a first predetermined current for reception by the output-stage circuit according to the first output current and the first adjustment current; and outputting, by the second mirror current source of the differential input amplification-stage circuit, a second predetermined current for reception by the output-stage circuit according to the second output current and the second adjustment current.

16. The method according to claim 15, wherein:

receiving, by the first bulk-driven transistor of the differential input amplification-stage circuit, the control voltage comprises receiving the control voltage by a first end of the first bulk-driven transistor, wherein a control end of the first bulk-driven transistor is grounded;

receiving, by the first bulk-driven transistor of the differential input amplification-stage circuit, the first input voltage comprises receiving the first input voltage by a bulk of the first bulk-driven transistor;

outputting, by the first bulk-driven transistor of the differential input amplification-stage circuit, the first output current to the first mirror current source of the differential input amplification-stage circuit comprises outputting the first output current by a second end of the first bulk-driven transistor to the first mirror current source, wherein the second end of the first bulk-driven transistor is connected to the first mirror current source;

receiving, by the second bulk-driven transistor of the differential input amplification-stage circuit, the control voltage comprises receiving the control voltage by a first end of the second bulk-driven transistor, wherein a control end of the second bulk-driven transistor is grounded, and wherein the first end of the second bulk-driven transistor is connected to the first voltage output end;

receiving, by the second bulk-driven transistor of the differential input amplification-stage circuit, the second input voltage comprises receiving the second input voltage by a bulk of the second bulk-driven transistor; and outputting, by the second bulk-driven transistor of the differential input amplification-stage circuit, the second output current to the second mirror current source of the differential input amplification-stage circuit comprises outputting the second output current by a second end of the second bulk-driven transistor to the second mirror current source, wherein the second end of the second bulk-driven transistor is connected to the second mirror current source.

17. The method according to claim 16, further comprising:

receiving, by a control end of a third bulk-driven transistor of the differential input amplification-stage circuit, a first bias voltage;

controlling, by the control end of the third bulk-drive transistor of the differential input amplification-stage circuit, a voltage output from each of the first voltage output end, the second voltage output end, and a third voltage output end of the voltage source;

receiving, by a first end of the third bulk-driven transistor of the differential input amplification-stage circuit, a working voltage;

utilizing, by the differential input amplification-stage circuit, the second voltage output end as a second end of the third bulk-driven transistor, wherein a bulk of the third bulk-driven transistor is connected to a control end of a fourth bulk-driven transistor of the differential input amplification-stage circuit;

receiving, by a first end of the fourth bulk-driven transistor of the differential input amplification-stage circuit, the working voltage;

utilizing, by the differential input amplification-stage circuit, a second end of the fourth bulk-driven transistor as the first voltage output end, wherein a bulk of the fourth bulk-driven transistor is connected to a control end of a first transistor of the differential input amplification-stage circuit;

receiving, by a first end of the first transistor, the working voltage; and utilizing, by the differential input amplification-stage circuit, a second end of the first transistor as the third voltage output end.

18. The method according to claim 17, further comprising:

receiving, by a first end of a fifth bulk-driven transistor of the differential input amplification-stage circuit, the working voltage, wherein a control end of the fifth bulk-driven transistor is connected to the second end of the fourth bulk-driven transistor, wherein a second end of the fifth bulk-driven transistor is connected to a first end of a second transistor of the differential input amplification-stage circuit, wherein a bulk of the fifth transistor is connected to the second end of the fourth bulk-driven transistor, wherein a control end of the second transistor is connected to a second end of the second transistor, wherein the first end of the second transistor is connected to a first end of a third transistor of the differential input amplification-stage circuit, wherein a second end of the third transistor is connected to a second end of the fourth transistor, a control end of the third transistor is connected to the second end of the third transistor, wherein a control end of a fourth transistor is connected to the third voltage output end, wherein a first end of the fourth transistor is grounded, wherein the second end of the fourth transistor is connected to the first mirror current source to output the first adjustment current to the first mirror current source, wherein a first end of a fifth transistor of the differential input amplification-stage circuit is grounded, wherein a second end of the fifth transistor is connected to the second end of the second transistor and the second mirror current source to output the second adjustment current to the second mirror current source, and wherein the control end of the fifth bulk-driven transistor is connected to the second voltage output end;

receiving, by a control end of a sixth transistor of the differential input amplification-stage circuit, the first bias voltage; and receiving, by a first end of the sixth transistor of the differential input amplification-stage circuit, the working voltage, wherein a second end of the sixth transistor is connected to the first end of the third transistor.

19. The method according to claim 18, further comprising:

receiving, by a control end of a seventh transistor of the first mirror current source, the working voltage;

receiving, by a first end of the seventh transistor, the first output current and the first adjustment current, wherein the first end of the seventh transistor is connected to a second end of an eighth transistor of the first mirror current source, wherein a second end of the seventh transistor is connected to the second voltage output end and a control end of the eighth transistor, wherein the control end of the eighth transistor is connected to a control end of a ninth transistor of the first mirror current source, wherein a first end of the eighth transistor is grounded, wherein a first end of the ninth transistor is grounded; and outputting, by a second end of the ninth transistor, the first predetermined current to the output-stage circuit, wherein the second end of the ninth transistor is connected to the output-stage circuit.

20. The method according to claim 19, further comprising:

receiving, by a control end of a tenth transistor of the second mirror current source, the working voltage;

receiving, by a second end of an eleventh transistor of the second mirror current source, the second output current and the second adjustment current, wherein a first end of the tenth transistor is connected to the second end of the eleventh transistor, wherein a second end of the tenth transistor is connected to the third voltage output end and a control end of the eleventh transistor, wherein a control end of the eleventh transistor is connected to a control end of a twelfth transistor of the second mirror current source, wherein a first end of the eleventh transistor is grounded, wherein a first end of the twelfth transistor is grounded;

outputting, by a second end of the twelfth transistor, the second predetermined current to the output-stage circuit, wherein the second end of the twelfth transistor is connected to the output-stage circuit.

21. The method according to claim 20, wherein:

each of the first bulk-driven transistor, the second bulk-driven transistor, the third bulk-driven transistor, the fourth bulk-driven transistor, and the fifth bulk-driven transistor is an N-type bulk-driven transistor;

the control end of each of the first bulk-driven transistor, the second bulk-driven transistor, the third bulk-driven transistor, the fourth bulk-driven transistor, and the fifth bulk-driven transistor comprises a gate of the N-type bulk-driven transistor;

the first end of each of the first bulk-driven transistor, the second bulk-driven transistor, the third bulk-driven transistor, the fourth bulk-driven transistor, and the fifth bulk-driven transistor comprises a source of the N-type bulk-driven transistor;

the second end of each of the first bulk-driven transistor, the second bulk-driven transistor, the third bulk-driven transistor, the fourth bulk-driven transistor, and the fifth bulk-driven transistor comprises a drain of the N-type bulk-driven transistor;

each of the first transistor, the second transistor, and the third transistor is an N-type transistor;

the control end of each of the first transistor, the second transistor, and the third transistor is a gate of the N-type transistor;

the first end of each of the first transistor, the second transistor, and the third transistor is a source of the N-type transistor;

the second end of each of the first transistor, the second transistor, and the third transistor is a drain of the N-type transistor;

each of the fourth transistor, the fifth transistor, the sixth transistor, the seventh transistor, the eighth transistor, the ninth transistor, the tenth transistor, the eleventh transistor, and the twelfth transistor is a P-type transistor;

the control end of each of the fourth transistor, the fifth transistor, the sixth transistor, the seventh transistor, the eighth transistor, the ninth transistor, the tenth transistor, the eleventh transistor, and the twelfth transistor comprises a gate;

the first end of each of the fourth transistor, the fifth transistor, the sixth transistor, the seventh transistor, the eighth transistor, the ninth transistor, the tenth transistor, the eleventh transistor, and the twelfth transistor comprises a source; and the second end of each of the fourth transistor, the fifth transistor, the sixth transistor, the seventh transistor, the eighth transistor, the ninth transistor, the tenth transistor, the eleventh transistor, and the twelfth transistor comprises a drain.

\* \* \* \* \*